United States Patent [19]
Monticelli

[11] 4,147,944
[45] Apr. 3, 1979

[54] COMPARATOR WITH SIGNAL RELATED ADAPTIVE BIAS

[75] Inventor: Dennis M. Monticelli, Fremont, Calif.

[73] Assignee: National Semiconductor Corporation, Santa Clara, Calif.

[21] Appl. No.: 844,759

[22] Filed: Oct. 25, 1977

[51] Int. Cl.² ............................ H03K 1/02; H03K 5/00
[52] U.S. Cl. ..................................... 307/362; 307/297; 307/355; 330/257; 330/297
[58] Field of Search ............... 307/296, 297, 355, 356, 307/362, 311; 330/297, 257; 354/44, 60 R

[56] References Cited
U.S. PATENT DOCUMENTS

| 3,530,396 | 9/1970 | Rudolph | 330/297 X |
| 3,935,524 | 1/1976 | Cap et al. | 307/362 X |

*Primary Examiner*—John Zazworsky
*Attorney, Agent, or Firm*—Gail W. Woodward

[57] ABSTRACT

A high gain differential amplifier is used in a comparator circuit. A bias control circuit is coupled to the differential amplifier so that its current is a multiple of the signal current. Input stage current drain is reduced by biasing the stage with a current source operating at a fraction equal to the signal current multiple. When so configured, the amplifier current and bias are related to the input current in a manner that permits good response to large signals and extended range response to small signals to give an extended dynamic range.

7 Claims, 5 Drawing Figures

U.S. Patent  Apr. 3, 1979  Sheet 1 of 2  4,147,944
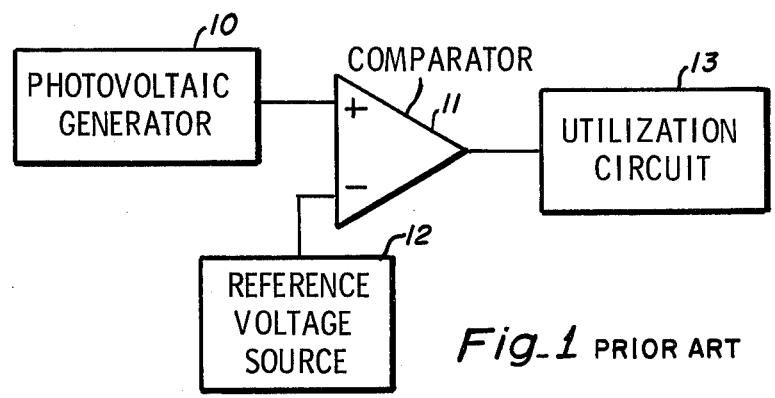
Fig_1 PRIOR ART
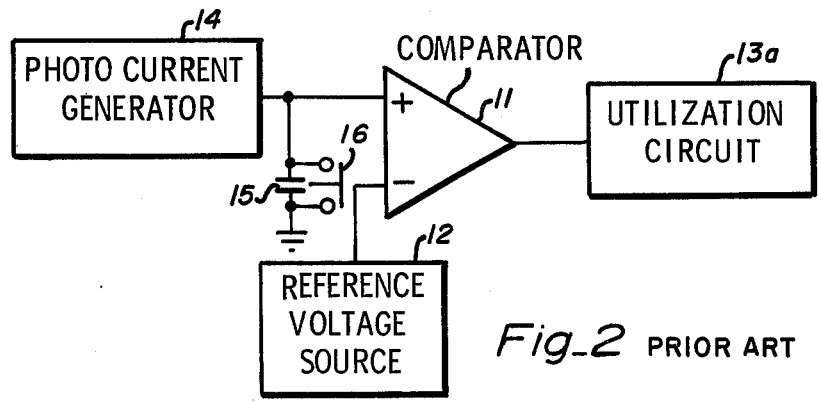
Fig_2 PRIOR ART
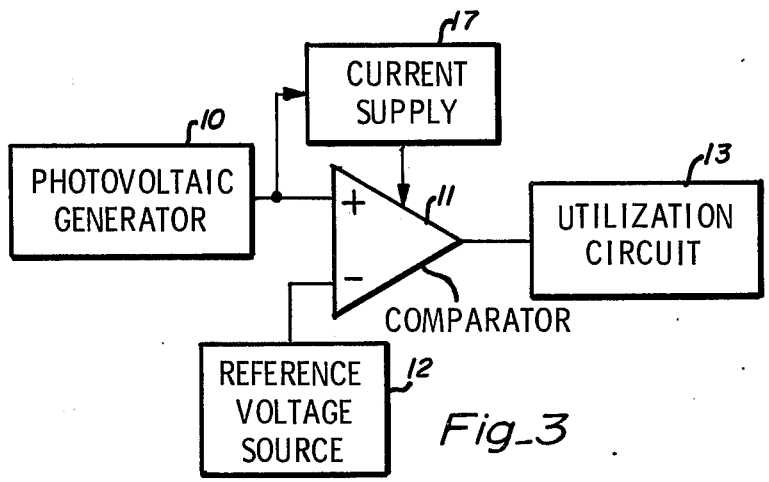
Fig_3
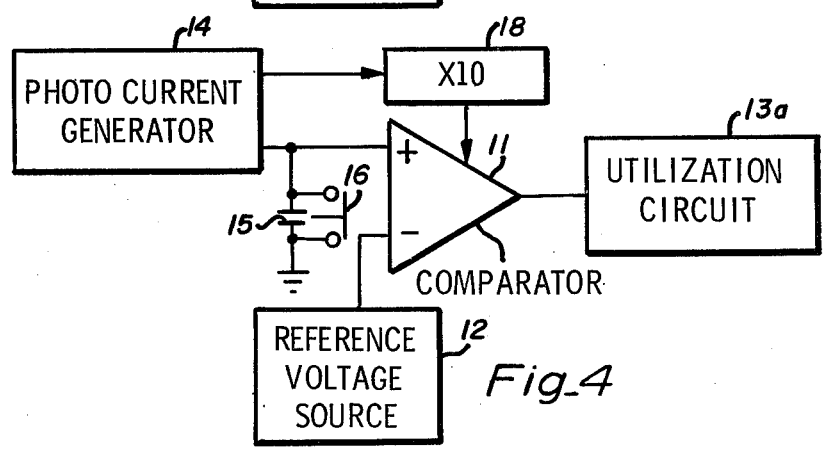
Fig_4

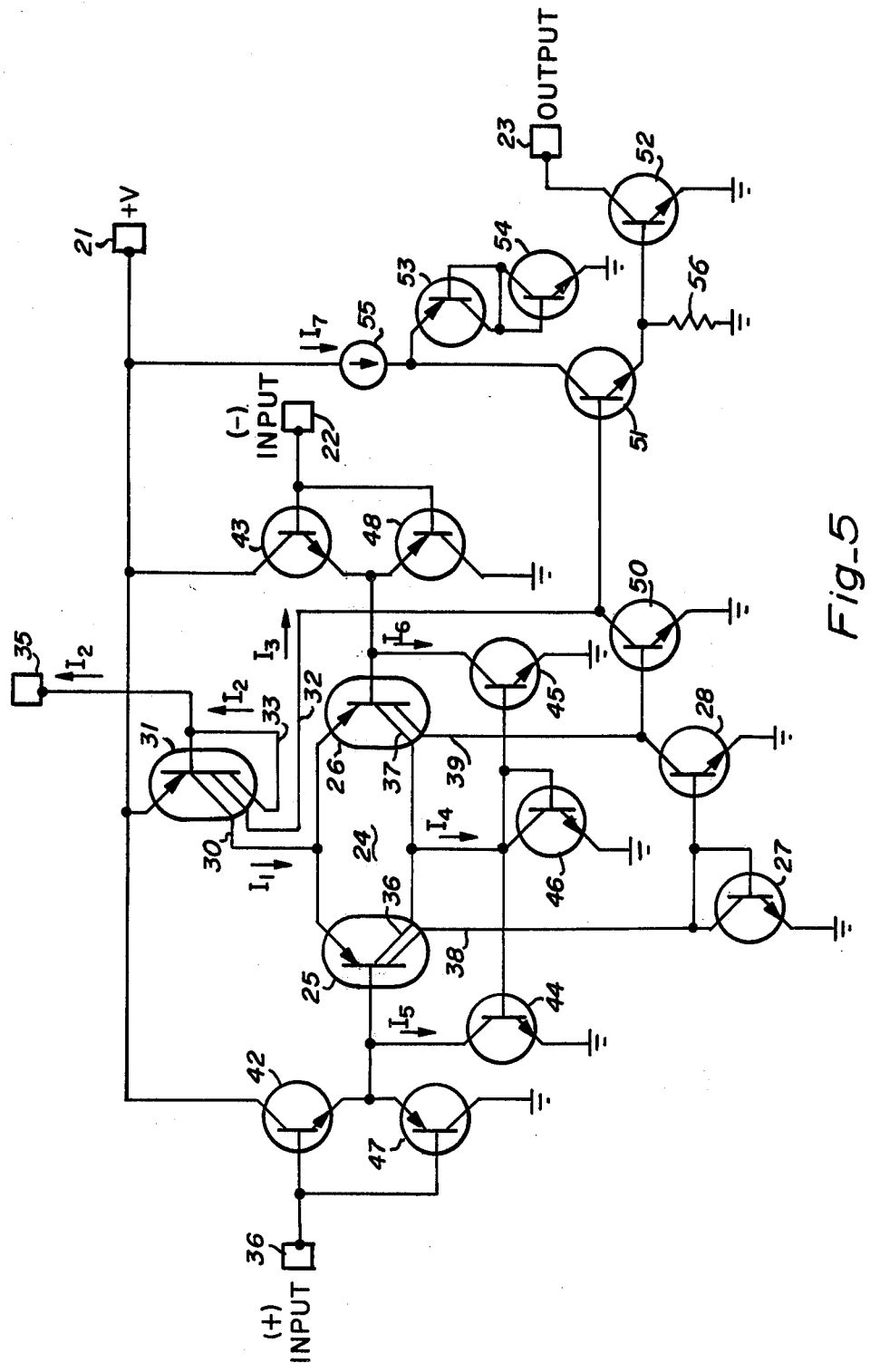
Fig_5

COMPARATOR WITH SIGNAL RELATED ADAPTIVE BIAS

BACKGROUND OF THE INVENTION

Comparators are ordinarily made to have high gain so that good limiting will occur even with relatively small signals. The ideal voltage comparator has a reference voltage input and a signal voltage input. When the signal voltage exceeds the reference, the output is a logic one (or logic zero, depending on the inputs used). When the signal voltage is less than the reference, the output is a logic zero (or logic one depending on the inputs used). The input current drain is made as low as possible so as to reduce voltage errors that develop due to the finite internal impedance of the signal voltage source.

In monolithic integrated circuit (IC) design JFET input stages are commonly used to reduce current drain to a minimum. A bipolar transistor input stage requires base current to turn it on whereas a JFET displays only a leakage current that can be made small. However, JFET structures require relatively large IC chip area for good performance and extra processing steps are usually required. Also, while JFET gate leakage current is small at room temperature (about 300° K.), the leakage rises with temperature. At about 400° K. the major advantage of the JFET is substantially reduced.

SUMMARY OF THE INVENTION

It is an object of the invention to provide an IC using bipolar transistors that are adaptively biased so as to greatly reduce input current drain.

It is a further object of the invention to adaptively bias the input transistors in a bipolar comparator IC to reduce input voltage errors.

It is a still further object of the invention to employ adaptively biased bipolar transistors to replace the JFET input transistors in a comparator circuit having both small size and low input current.

These and other objects are achieved in a bipolar transistor IC. A high gain differential amplifier configuration is employed. The amplifier tail current is made a function of the signal input, preferably at a convenient multiple thereof. The input transistor stage is operated into a load that is also adaptively biased in accordance with the signal input. Thus the input current required to turn the first transistor on can be made to be a small fraction of the current available, thereby reducing input errors to a small value.

Using the invention with bipolar transistors in IC form, very small input stage transistors can be made to display input impedance values as high as those of JFET circuits. Since the bipolar transistors can be made much smaller than the JFETS they replace, shunt capacitance and IC chip area are greatly reduced.

BRIEF DESCRIPTION OF THE DRAWING

FIG. 1 is a block diagram of a prior art comparator using a photovoltaic input;

FIG. 2 is a block diagram of a prior art comparator using a photo current source with an integrating capacitor;

FIG. 3 is a block diagram of the comparator of the invention with a photovoltaic input;

FIG. 4 is a block diagram of the comparator of the invention using a photo current source with an integrating capacitor; and FIG. 5 is a schematic diagram of the preferred comparator circuit of the invention.

DESCRIPTION OF THE INVENTION

FIG. 1 is a block diagram of a prior art circuit using a comparator. A photovoltaic source 10 is coupled to comparator 11. Reference voltage source 12 is coupled to the other comparator input. When the voltage from source 10 exceeds the reference voltage, the output of comparator 11 will be high. When the voltage from source 10 is below the reference voltage, the output will be low. Utilization circuit 13 responds to the state of the output of comparator 11 to perform some desired function. For example, the circuit of FIG. 1 can be used in a camera to prevent its operation when the ambient light drops below some predetermined value. Alternatively, in an automatic camera, utilization circuit 13 can switch a flash unit into operation with the camera when the ambient light falls below the predetermined level.

FIG. 2 shows another comparator application. Here a photo current source 14 is coupled to the comparator 11 and an integrating capacitor 15 integrates the photo current to generate a voltage ramp. Switch 16 acts to discharge capacitor 15 when desired. In this circuit, as switch 16 is first allowed to go open from a closed state, the voltage on capacitor 15 is initially zero. The output of comparator 11 will be low. As photo current flows, as a function of ambient light, capacitor 15 will charge as a function of integrated light. At the point where the charge on capacitor 15 exceeds the reference voltage from source 12, the comparator 11 output will go high. Thus the utilization circuit 13a could be used to operate the camera exposure control so that the film is exposed in accordance with the ambient light integral.

Comparators have a sensitivity rating which expresses their ability to respond to a small change in voltage. That is, the smaller the change in voltage that will drive the output from one extreme to the other, the greater the sensitivity. High sensitivity is generally desired so that the comparator tends to act more like a switch and provides an analog to digital conversion function. It can be seen that high sensitivity is needed if an accurate A-D conversion is to be achieved. This in turn means that comparators in general have high gain and are therefore responsive to very small voltage changes. This characteristic also makes the comparator sensitive to voltage errors. In a photovoltaic device as shown in FIG. 1, such devices have a finite internal impedance which acts as a voltage divider in conjunction with the input current of comparator 11. Making the comparator input current low will reduce the division ratio, but the high comparator sensitivity makes it more responsive to such errors. Particularly at low light levels where the photo voltage is low and the internal impedance tends to be high, errors are difficult to avoid.

In the circuit of FIG. 2, where a photo current source is employed at low light levels, the current can approach the value of current required to operate the comparator. If the current required to switch the comparator equals or exceeds the photo current, the capacitor will not charge and the circuit will hang up. Even with a current high enough to produce capacitor charging, the current flowing in the comparator input can introduce an error in the form of a reduced charging ramp.

FIG. 3 shows how the invention can be applied to a comparator to reduce voltage errors. Comparator 11 is operated in part from a current supply 17 which is controlled as a function of the input to the comparator. Thus, at low input levels the comparator is operated at lower current, which reduces input errors. At high input levels the opeating current is increased to handle the increased signal. This is a form of adaptive biasing.

FIG. 4 shows the invention applied to a comparator operated from an integrated photo current source. The signal current generator 14 operating through a current multiplier 18 operates the biasing of comparator 11. Thus, as the photo current generator 14 produces very small current at the lower light levels, comparator 11 is operated at reduced current, thereby reducing the input current requirement and thus the conversion errors.

FIG. 5 is a schematic diagram of an IC version of a circuit wherein a comparator is provided with adaptive biasing for reducing input errors at low current. This circuit contains the active elements of block 11 of FIGS. 3 and 4.

In FIG. 5 the square symbols represent chip pads of an IC. Pad 21 is the terminal that connects to +V, a source of power supply voltage referenced to ground.

For the following discussion, the inverting input at pad 22 will be regarded as the reference input which is supplied with a fixed reference potential. The inverting input is referenced with respect to the signal at output pad 23. It is to be understood that either input can be employed as signal or reference terminals.

The comparator is constructed around differential amplifier 24, which consists of dual collector transistors 25 and 26. Transistors 27 and 28 are connected into a conventional active load configuration for amplifier 24. The tail current for amplifier 24 is designated $I_1$ and is obtained from one collector 30 of a three collector transistor 31. Collector 33 is coupled to the base of transistor 31 and collector 32 supplies $I_3$ to be described hereinafter. If collectors 30, 32, and 33 are made to have the same areas, and emitter-collector spacing, currents $I_1$, $I_2$, and $I_3$ will be equal. Since collector 33 is coupled back to the base of transistor 31, the current $I_2$ at pad 35, which is the bias control current, will set the values of $I_1$ and $I_3$.

Bias control at pad 35 will ordinarily be connected to a current sink (not shown) operated as a function of the signal at input terminal 36. $I_2$ is normally made a multiple, such as X10, of the current available from the signal source connected to terminal 36. For example see FIG. 4. It should be noted that this current gain function can, under certain conditions, be built into transistor 31. If the lateral PNP transistor process being used is capable of producing high Beta transistors, collector 33 can be made 1/10 as large as the other collectors. This will make $I_1$ ten times $I_2$. The amplifier function 18 of FIG. 4 would then be a part of the comparator itself.

In order to achieve high sensitivity, amplifier 24 is driven from a pair of emitter follower stages involving transistors 42 and 43. Their emitter currents are set by transistors 44 and 45, which act as load devices. Transistors 44 and 45 have their base-emitter circuits operated by diode-connected transistor 46, with the combination being operated at $I_4$ from collectors 36 and 37. If the emitter areas of transistors 44-46 are the same, $I_4$ will be mirrored at both collectors as $I_5$ and $I_6$.

For the current ratio of 10:1, as established above, collector 38 of transistor 25 is made nine times the size of collector 36 and, similarly collector 39 of transistor 26 will be made nine times the size of collector 37. Using these ratios, $I_4$ will be 1/10 of $I_1$ regardless of the differential voltage appearing between the base of transistors 25 and 26 which in turn reflect the differential input voltage of the comparators as a whole. Thus $I_5$ and $I_6$ will approximate the input circuit current cpability. Since transistor 42 has a Beta, or current gain, of better than 100 in a typical IC process, the current drive requirement at terminal 36 will always be less than 1% of the capability of the source connected to it. In effect, the input impedance of the comparator is made over 100 times larger than the internal impedance of the source connected thereto. This adaptive biasing ensures that input voltage errors are reduced to less than 1%.

Strictly speaking, the adaptive biasing would be effective if applied only to the driven side of the comparator. However, symmetry is maintained so that the signal input can be applied to either the noninverting input, as shown, or the inverting input if desired. In addition, a symmetrical circuit, as shown, will maintain low input offset voltage over a wide range of adaptive bias currents and temperatures.

In addition to the above-mentioned device area ratioing, it is desirable that the emitter area of transistor 42 be equal to that of transistor 43 and the emitter area of transistor 27 be equal to the area of transistor 28.

Transistors 47 and 48 are present for transient response improvement and the symmetrical arrangement employed for the reasons cited above. The collector of transistor 44 comprises a circuit node that includes the emitter of transistor 42 and the base of transistor 25. This node has capacitance that can be rapidly pulled toward +V by conduction in transistor 42 due to a positive transient at terminal 36. There is no equivalent discharge path (other than the small current, $I_5$) because transistor 42 will turn off for a negative transient. With transistor 47 present, a negative transient at terminal 36 will turn it on and rapidly pull the node toward ground potential. Thus, transistors 47 and 48 are for the purpose of transient recovery speedup.

The output of the differential amplifier is sensed at the collector of active load transistor 28 which is directly coupled to the base of transistor 50. The collector of transistor 50 is adaptively biased by $I_3$ from collector 32 and the base of transistor 50 is adaptively driven from collector 39 of transistor 26. These currents are ratioed so that when transistor 50 is turned on, it will be saturated so as to turn transistor 51 and hence transistor 52 off. Without such adaptive bias in the second gain stage, transistor 50 would present an excessive load to the output of the first stage amplifier, 24, for low input signal levels.

When transistor 50 is turned off, $I_3$ will flow in the base of transistor 51. Because $I_3$ could get large enough to cause transistor 51 to carry more current that is needed to effectively switch transistor 52, and thus draw excessive supply current, a needed current limit function is provided by current source, 55. The value of current source 55 is $I_7$ and is made equal to approximately 200uA, which is enough to drive output transistor 52 to conduct several tens of mA. Note that even for very small levels of adaptive bias, transistor 52 will continue to be able to switch although its current sinking ability would be impaired. Transistor 52 stops switching when $I_3 \times B_{51} < V_{BE}/R_{56}$. For resistor 56, $R_{56}$, equal to 100k and $B_{51}=200$, this corresponds to a minimum $I_3$ of 30 nA. Should output switching be desired for $I_3 < 30$ uA, $R_{56}$ could be replaced with a signal dependent current sink drawing approximately $I_3$.

Diode connected transistors 53 and 54 act to pass $I_7$ when transistor 51 is turned off and operate to limit the potential of the collector to about 1.2 volts. The entire circuit will be operative to potentials of +V of about 2.5 volts and above.

The adaptive biased comparator has been shown and the operation of a preferred embodiment described. Clearly there are alternatives and equivalents that will occur to a person skilled in the art and will still be within the spirit and intent of the invention. Accordingly, it is intended that the scope of the invention be limited only by the claims that follow.

I claim:

1. In a voltage responsive comparator, said comparator including a differential amplifier having means for supplying a source of operating current, differential inputs, and an output that constitutes said comparator output, means for coupling a reference voltage to one of said differential inputs, and means for coupling a voltage source to the other of said differential inputs, said comparator ordinarily producing an error when coupled to voltage sources of limited current capability, the improvement comprising:

means for controlling said operating current in proportion to the current available from said voltage source; and means for biasing at least one input of said differential amplifier in proportion to said current available from said voltage source whereby said differential amplifier responds to said voltage source at current levels substantially below those useful in comparators without said improvement.

2. The improvement of claim 1 wherein said means for controlling operates at a current that is a multiple of said current available from said voltage source.

3. The improvement of claim 2 wherein said means for biasing operates at a current substantially equal to said current available from said voltage source.

4. The improvement of claim 2 wherein said multiple is on the order of ten.

5. A voltage comparator having inverting and noninverting input terminals, an output terminal, and a current control terminal, said comparator comprising:

a differential amplifier having means for coupling to a source of operating current, a pair of inputs coupled respectively to said inverting and noninverting input terminals, a common mode output, and a differential output;

means coupled to said control terminal for controlling said operating current in said differential amplifier;

means for developing a second current in proportion to said operating current;

means for combining said differential output and said second current to provide a signal at said output terminal of said comparator.

6. The comparator of claim 5 further including amplifier means comprising:

a first amplifier having an input coupled to said inverting input and an output coupled to one of said differential amplifier inputs;

a second amplifier having an input coupled to said noninverting input and an output coupled to the other of said differential amplifier inputs; and means for supplying current to said first and second amplifiers as a function of said common mode output.

7. The comparator of claim 6 further including a current mirror responsive to said common mode output and having a pair of outputs one of which is coupled to said first amplifier and the other of which is coupled to said second amplifier.

* * * * *